(12) United States Patent
Haapalinna

(10) Patent No.: US 9,312,345 B2
(45) Date of Patent: Apr. 12, 2016

(54) HIGH-RESISTIVE SILICON SUBSTRATE WITH A REDUCED RADIO FREQUENCY LOSS FOR A RADIO-FREQUENCY INTEGRATED PASSIVE DEVICE

(71) Applicant: OKMETIC OYJ, Vantaa (FI)

(72) Inventor: Atte Haapalinna, Espoo (FI)

(73) Assignee: OKMETIC OYJ, Vantaa (FI)

( * ) Notice: Subject to any disclaimer, the term of this patent is extended or adjusted under 35 U.S.C. 154(b) by 0 days.

(21) Appl. No.: 14/554,435

(22) Filed: Nov. 26, 2014

(65) Prior Publication Data
US 2015/0145105 A1    May 28, 2015

(30) Foreign Application Priority Data
Nov. 26, 2013  (FI) ...................................... 20136180

(51) Int. Cl.
| H01L 21/00 | (2006.01) |
| H01L 29/32 | (2006.01) |
| H01L 29/16 | (2006.01) |
| H01L 29/04 | (2006.01) |
| H01L 21/02 | (2006.01) |
| H01L 23/66 | (2006.01) |
| H01L 21/304 | (2006.01) |

(52) U.S. Cl.
CPC .......... *H01L 29/32* (2013.01); *H01L 21/02002* (2013.01); *H01L 21/02008* (2013.01); *H01L 21/02013* (2013.01); *H01L 21/304* (2013.01); *H01L 23/66* (2013.01); *H01L 29/04* (2013.01); *H01L 29/16* (2013.01); *H01L 2924/0002* (2013.01)

(58) Field of Classification Search
CPC ......... H01L 29/32; H01L 23/66; H01L 29/16; H01L 21/02013
See application file for complete search history.

(56) References Cited

U.S. PATENT DOCUMENTS

| 7,868,419 | B1 | 1/2011 | Kerr et al. |
| 8,378,384 | B2 | 2/2013 | Schulze et al. |
| 8,466,036 | B2 * | 6/2013 | Brindle .................. H01L 21/84 438/455 |
| 8,835,281 | B2 | 9/2014 | Brindle et al. |
| 2009/0236689 | A1 | 9/2009 | Daly et al. |
| 2010/0230789 | A1 | 9/2010 | Yorita et al. |
| 2012/0161310 | A1 | 6/2012 | Brindle et al. |

(Continued)

FOREIGN PATENT DOCUMENTS

| EP | 1 835 536 A2 | 9/2007 |
| EP | 2043137 | 4/2009 |
| WO | 2012087580 | 6/2012 |

OTHER PUBLICATIONS

FI Search Report, dated Jun. 26, 2014, from corresponding FI application.

(Continued)

*Primary Examiner* — Laura Menz
(74) *Attorney, Agent, or Firm* — Young & Thompson

(57) ABSTRACT

The application relates to a high-resistivity silicon substrate (100) with a reduced radio frequency loss for a radio frequency integrated passive device. The substrate comprising a bulk zone (110) comprising high-resistivity bulk silicon and a preserved sub-surface lattice damage zone (120*b*) comprising fractured silicon above the bulk zone. The lattice damage zone is processed into the substrate and the preserved lattice damage zone is configured to achieve the RF loss reduction of the substrate by suppressing a parasitic surface conduction.

10 Claims, 4 Drawing Sheets

(56) References Cited

U.S. PATENT DOCUMENTS

| | | |
|---|---|---|
| 2012/0235283 A1 | 9/2012 | Libbert et al. |
| 2013/0037922 A1 | 2/2013 | Arriagada et al. |
| 2013/0084689 A1 | 4/2013 | Arriagada et al. |
| 2015/0014795 A1 | 1/2015 | Franosch et al. |

OTHER PUBLICATIONS

International Search Report, dated Mar. 13, 2015, in Application No. PCT/FI2014/050910.

* cited by examiner

HIGH-RESISTIVE SILICON SUBSTRATE WITH A REDUCED RADIO FREQUENCY LOSS FOR A RADIO-FREQUENCY INTEGRATED PASSIVE DEVICE

TECHNICAL FIELD

The application relates generally to a high-resistivity silicon (HRS) substrate with a reduced radio frequency (RF) loss for a RF integrated passive device (RF-IPD).

BACKGROUND

Availability of high-resistivity silicon substrates has provided a major new opportunity for developing and marketing RF components, especially integrated passive devices (IPDs). Due to compatibility with established integrated circuit (IC) manufacturing technology, availability, and cost, HRS has turned out to be an nearly ideal substrate for RF-IPDs.

However, surface effects continue to pose issues, partially masking the potentially low RF loss levels in obtainable with advanced HRS substrates. Namely, charges trapped at the silicon-dielectric interface or within the dielectric layer itself can create accumulation or inversion layers, which enable parasitic surface conduction channels to be generated. These parasitic channels generate stray currents in an RF field. These stray currents, in turn, increase transmission line attenuation, reduce obtainable Q-factors in inductors, and reduce the selectivity of filters manufactured on this substrates.

Methods have been devised to overcome the performance limitations posed by these surface effects. Most commonly used methods are a relatively heavy implantation with neutral species such as argon, silicon, neutrons, or protons (M. Spirito, F. Maria de Paola, L. Nanver, E. Valletta, B. Rong, B. Rejaei, L. C. N. de Vreede, J. J. N. Burghartz, "Surface-Passivated High-Resistivity Silicon as True Microwave Substrate" IEEE Transaction on Microwave Theory and Techniques, Vol. 53, No. 7, July 2005; Chan, K. T., Chin, A., Chen, Y. B., Lin, Y. -D, et al, "Integrated antennas on Si, proton-implanted Si and Si-on-quartz" IEDM '01 Technical Digest, IEEE International, 2001) and a deposition of amorphous polysilicon layers (B. Rong, J. N. Burghartz, L. K. Nanver, B. Rejaei, and M. van der Zwan, "Surface-Passivated High-Resistivity Silicon Substrates for RFICs" IEEE Electron device letters, Vol. 25, No. 4, April 2004) on top of the HRS substrates. An amorphous/polysilicon deposition has also been applied to handle wafers used in SOI manufacturing (D. Lederer and J. -P. Raskin, "RF performance of a commercial SOI technology transferred onto a passivated HR silicon substrate," IEEE Transaction on Electron Devices, July 2008). Suppression effect in all of these methods is based on enhanced trapping of charge carriers within the implanted or polysilicon layer on a top of the HRS substrate.

However, all these methods induce additional cost effects, and they pose limitations in HRS-based device processes. These issues have limited the viability of these methods.

SUMMARY

One object of the invention is to withdraw the above-mentioned drawbacks and to provide a high-resistivity silicon substrate with reduced radio frequency signal losses and, consequently, higher performance for a radio frequency integrated passive devices build on the substrate.

One object of the invention is fulfilled by providing a high-resistivity silicon substrate of claim 1, a method of claim 9, and a radio frequency integrated passive device of claim 10.

One embodiment of a high-resistivity silicon substrate with a reduced radio frequency loss for a radio frequency integrated passive device comprising a bulk zone comprising high-resistivity bulk silicon. The substrate further comprising a preserved sub-surface lattice damage zone, which is processed into a front side of the substrate, that forms the front surface and comprises fractured silicon above the bulk zone. The lattice damage zone is processed into the substrate and the preserved lattice damage zone is configured to achieve the RF loss reduction of the substrate by suppressing a parasitic surface conduction.

The term "surface passivation" refers to e.g. a treatment given to a surface of a silicon wafer for inhibiting parasitic surface conduction-enabled stray current generation under an RF excitation.

The term "high-resistivity silicon" refers to semiconductor grade silicon crystal, which has an exceptionally high resistivity, e.g. typically above 100 Ohm-cm or more. Standard silicon resistivities range from below 1 up to 10-20 Ohm-cm.

The term "radio frequency integrated passive device" refers to passive components, e.g. conductors, inductors, notch filters, bulk acoustic wave (BAW) filters, thin film bulk acoustic wave resonators (FBAR), and other types of filters, which have been integrated on a suitable platform, e.g. on a high resistivity silicon.

One embodiment of a method for manufacturing the high-resistivity silicon substrate with the reduced radio frequency loss for a radio frequency integrated passive device comprising growing a high-resistivity silicon, and processing the grown silicon for slicing a silicon wafer from the grown silicon and for thinning the sliced silicon wafer. The processing achieves a lattice damage zone comprising fractured silicon into a processed silicon wafer. The method further comprising polishing the processed silicon wafer for obtaining the substrate, which comprises a bulk zone comprising high-resistivity bulk silicon, and preserving, by the polishing, at least a part of the lattice damage zone above the bulk zone, which at least part of lattice damage zone is configured to achieve the RF loss reduction of the substrate by suppressing a parasitic surface conduction.

One embodiment of a radio frequency integrated passive device comprising the high-resistivity silicon substrate with a reduced radio frequency loss. The substrate comprising a bulk zone comprising high-resistivity bulk silicon and a preserved sub-surface lattice damage zone, which is processed into a front side of the substrate, that forms the front surface and comprises fractured silicon above the bulk zone. The lattice damage zone is processed into the substrate and the preserved lattice damage zone is configured to achieve the RF loss reduction decrease of the substrate by suppressing a parasitic surface condition.

Further embodiments of the invention are defined in dependent claims.

The verb "to comprise" is used in this document as an open limitation that neither excludes nor requires the existence of also unrecited features. The verbs "to include" and "to have/has" are defined as to comprise.

The terms "a", "an" and "at least one", as used herein, are defined as one or more than one and the term "plurality" is defined as two or more than two.

The term "another", as used herein, is defined as at least a second or more.

The term "or" is generally employed in its sense comprising "and/or" unless the content clearly dictates otherwise.

For the above-mentioned defined verbs and terms, these definitions shall be applied, unless a different definition is given in the claims or elsewhere in this description/specification.

Finally, the features recited in depending claims are mutually freely combinable unless otherwise explicitly stated.

BRIEF DESCRIPTION OF THE FIGURES

The exemplary embodiments of the invention will be described with reference to the accompanying figures, in which.

DETAILED DESCRIPTION OF THE FIGURES

Figure 0:
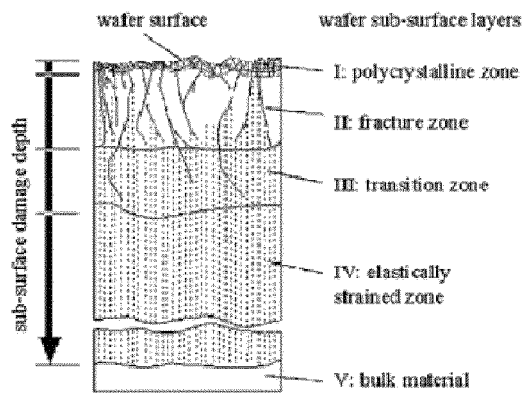
FIG. 0 illustrates a sub-surface damage model.

FIG. 0 illustrates a sub-surface damage model (H. -F. Hadamovsky, Werkstoffe del Halbleitertechnik; Leipzig: Deutcher verlag für Grundstofftechnik, 1990).

The method 200 for manufacturing a HRS substrate (wafer) 100 is used for generating sufficient depth and extent for a fracture zone illustrated in FIG. 0 so that as a top surface of a wafer surface is finalized by a non-damaging chemical-mechanical planarization (CMP)-polishing technique. An uppermost layer is removed and a charge carrier trapping, and parasitic conductance suppression will take place in the fracture zone, which is left in the final wafer 100. The previously used common method, the high dose implantation, is typically limited to a perturbed/fractured crystal damage level in order to avoid the amorphization dose and related issues in subsequent processing.

Figure 1A:
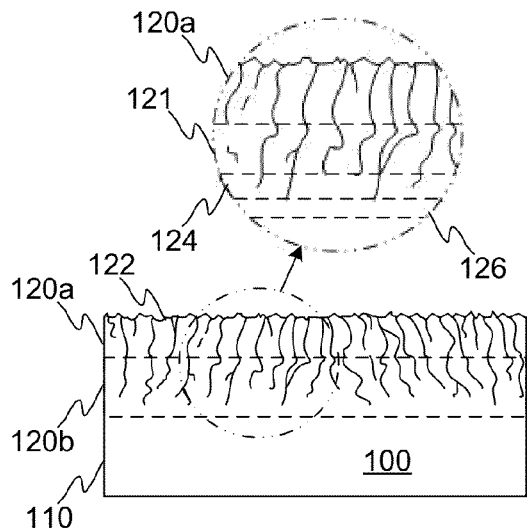
FIGS. 1*a*-1*b* illustrate a front side damaged HRS wafers before and after a polishing process.
Figure 1B:
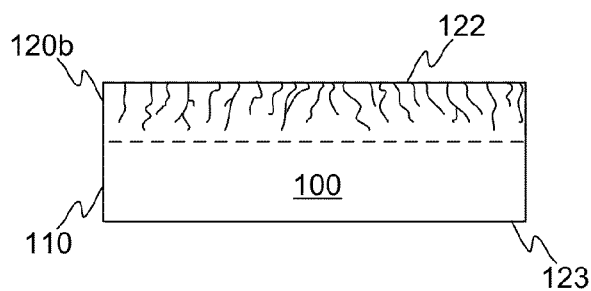
Figure 1C:
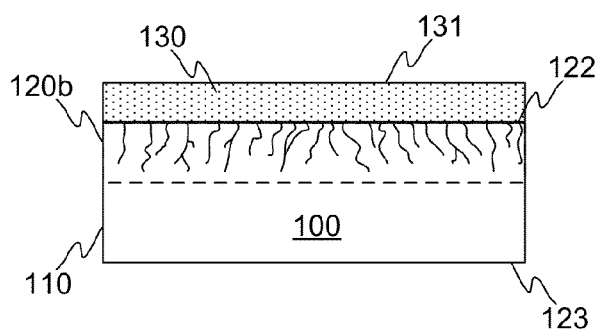
FIG. 1*c* illustrates a front side damaged HRS wafer, which has been completed with an optional polysilicon layer.
Figure 2:
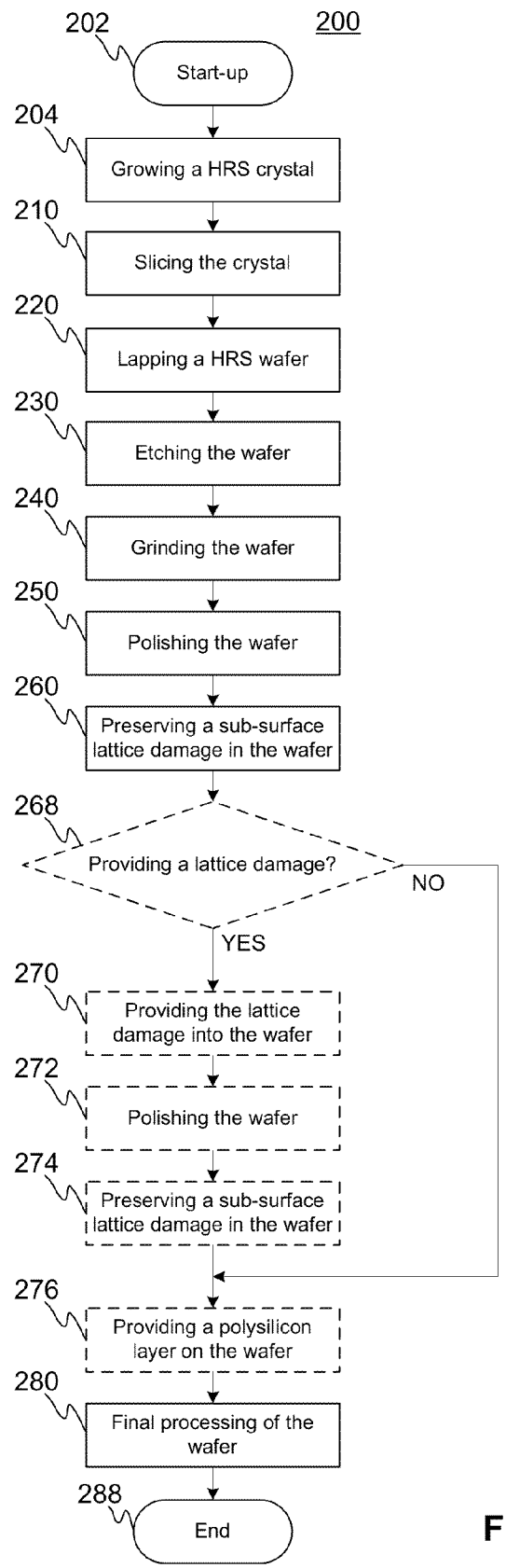
FIG. 2 illustrates an exemplary flowchart of a method for manufacturing a HRS wafer.

FIGS. 1*a*-1*b* and 2 illustrate the substrate 100 with reduced RF signal losses for RF-IPDs and the method 200 for manufacturing it.

In step 202, during the start up, a growing chamber is turned on and necessary service operations, e.g. checking operations concerning a condition of the chamber and adequacy of used reaction gases and a silicon charge, are performed.

In step 204 a HRS ingot is grown in the chamber and the grown ingot is processed by cutting and by grinding.

In step 210 HRS wafers are sliced from the processed ingot, e.g. by multi-wire slicing according to the current industry standard. The slicing process incorporates mechanically some sub-surface crystal lattice damage into the sliced wafers, whereupon the sliced wafers comprise a lattice damage zone comprising fractured silicon. Then, the sliced wafers are cleaned and edges of the sliced wafers are grinded.

In step 220 the sliced wafers are thinned by lapping for removing at least partly the slicing based crystal damage. The lapped wafers are then cleaned.

Since the lapping process also incorporates mechanically some sub-surface crystal lattice damage into the sliced wafers, the lapped wafers comprise a lattice damage zone, where is fractured silicon. Alternatively, if the slicing based crystal damage is meant to retain at least partly in the lapped wafers, it is possible to modify the lapping process so that at least a part of the slicing based lattice damage zone remains and the lapped wafers comprise the slicing and lapping based crystal damages. Another possibility for the same end effect is to bypass the lapping stage altogether.

In step 230 the lapped wafers are acid etched for removing at least partly the crystal damage(s) and, then, the etched wafers are inspected visually, cleaned, and processed by thermal donor annealing.

In step 240 the etched wafers are thinned by controlled grinding, which also incorporates mechanically a sub-surface crystal lattice damage into the etched wafers. Thus, the grinded wafers 100 of FIG. 1*a* comprise only the grinding based crystal damage, if the etching process has removed the slicing and/or lapping based crystal damage(s), or, alternatively, the grinding and previously processed crystal damage(s), when the grinding process is modified for retaining the previously processed crystal damage(s).

The grinding process can be provided e.g. by a rotational abrasive grinding. In addition, the grinding process can be executed by a controlled multistep grinding comprising a coarse grinding steps and a fine grinding steps.

In the two-step grinding process the coarse grinding stage is used to a standard stock removal and a deeper lattice damage generation. This is followed by a fine grinding stage in which the wafer surface 122 is planarized in preparation of the polishing. The fine grinding step can be implemented in two ways. One way is to increase lattice damage only in the very uppermost layer 120*a*, which normally will then be removed in polishing step 260, 270. Alternatively, the fine grinding damage depth can be increased so that even after polishing step 270 there will be an increase in the amount of lattice perturbations (damage) compared to the perturbations caused by the coarse grinding stage. The final polishing 260, 270 is used to further improve the wafer surface 122 properties for device processing (lithography). For some device processes, the surface preparation requirements are less stringent, but omission of one or more surface preparation step would not change the embodiment.

The grinding offers flexibility in the amount and intensity of the generated lattice damage. This enables adjustment of the passivation layer properties for the particular needs of the actual device processing process for which the substrate 100 is intended.

In step 260, the single-side polishing process is controlled so that a part 120*a* of the lattice damage zone is removed and at least a part 120*b* of the lattice damage zone above a bulk zone 110 is preserved as FIG. 1*b* illustrates.

This preserved lattice damage zone 120*b* is on the front side 122 of the substrate 100. The front side 122, which may be structurally single crystal silicon, forms the front surface 122. The preserved lattice damage zone 120*b*, which comprises fractured silicon, achieves the RF loss reduction of the front side damaged substrate 100 by suppressing a parasitic surface conduction. The lattice damage zone 120*b* may comprise a fracture zone 121, a transition zone 124, and an elastically strained zone 126 above the bulk silicon zone 110.

According to one embodiment of the invention, an RF-IPD comprising the front side damaged substrate 100 with reduced RF signal losses. The substrate 100 in the RF-IPD comprising a bulk zone 110 comprising high-resistivity bulk silicon and a preserved sub-surface lattice damage zone 120*b* comprising fractured silicon above the bulk zone 100. The lattice damage zone 120*b* has been processed mechanically into the substrate 100 and it is configured to achieve the RF loss reduction decrease of the substrate 100 by suppressing a parasitic surface condition.

According to one embodiment of the invention, the preserved lattice damage zone 120b in the RF-IPD substrate 100 is processed into a front side 122 of the substrate 100 and it forms the front surface 122.

It is also possible to implement the crystal damage to a normal, damage free front surface 122, when the lattice damage zone 120a, 120b is completely removed by the polishing by using wet sand blasting, laser manipulation, or brush damaging. However, all of these methods have the drawback of increasing cost and introducing steps in which contaminations are easily introduced to the wafer 100.

In step 268, if there is a need to provide a crystal lattice damage mechanically into the thinned wafers 100 by means of some another process, e.g. by brush damaging, laser manipulation, wet sandblasting, or dry sandblasting, in step 270, the thinned wafers 100 are brush damaged, laser manipulated, or wet sand blasted for providing such crystal damage.

In step 272, the damaged wafers 100, which comprise the bulk zone 110 comprising bulk silicon, are polished e.g. by CMP-polishing. The polishing process is directed especially to a front side 122 of the damaged wafers 100, which may be structurally single crystal silicon.

According to one embodiment of the invention, the polished front side 122 in the RF-IPD substrate 100 is structurally CMP-polished single crystal silicon.

In step 274, the polishing process is controlled so that at least a part of a provided lattice damage zone above the bulk zone 110 is preserved.

In step 276, it is possible to provide a polysilicon layer 130 by depositing it on the polished wafer surface 122—especially on the front side 122—so that the deposited layer 130 covers the top of the lattice damage zone 120a, 120b. The deposited layer 130 is then polished.

The additional layer 130 further enhances the passivation (reduction of induced losses) achieved through the lattice damaged zone 120a, 120b. It will increase the processing cost of passivated HRS wafers 100, but the resulting front surface 131 will be suitable for surface inspection methods commonly used in the semiconductor industry.

The thickness of the layer 130 for this purpose can be 0.2-8.0 μm and the optimal thickness is 0.4-6.0 μm. At the same time, the deposited layer 130 will enhance.

In step 280, the polished wafers 100 having the lattice damage zone 120b are final processed by sorting, cleaning, inspecting, and packing the polished wafers.

Then, in step 288, the method 200 ends.

In a typical HRS growing process, the guiding principle of the various mechanical manipulation steps 210, 220, 240, 250 is to remove all the crystal damage accumulated in the previous mechanical step 210, 220, 240, 250, but all of these could be modified so as to incorporate some crystal damage to the finished wafer 100.

The mechanical damage caused by multi-wire slicing, as well as lapping damage, have two major drawbacks. One, the metal contamination introduced from coated steel wire in slicing step 210 or from iron plates in lapping step 220 is highly detrimental for semiconductor processes, and all precautions should be taken to ensure that this contamination is not carried on to the final wafer 100. While the use of diamond wire slicing may provide some improvement, the best way to achieve this is to remove this damage entirely in the etching step 230.

In addition, both of these damages are introduced on both wafer surfaces 122, 123. The integrity of the wafer backside 123 is also an important feature for safe handling in a device processing line, and there are no convenient methods for removing the damage from the backside 123 only. Furthermore, the relatively costly polishing process can be shortened when the deep damage from slicing or lapping is not utilized.

The mechanical processing in which the damage is processed by rotational fixed abrasive grinding is commonly used in many advanced wafer processes, both in substrate wafer 100 processing and in the backgrinding of processed device wafers 100. The ground wafers 100 need only minimal processing to enable full compliance with the semiconductor processing requirements.

The implementation of the damage production is carried out through optimization of the grinding step 240 so that sufficient fracture zone 120b depth and damage intensity are ensured, and the polishing step 260 is limited to a relatively short step, which does not compromise the achieved suppression of the parasitic surface currents.

If the surface inspection criterions applied require the inclusion of the polysilicon layer 130, the inclusion of the lattice damaged zone 120a, 120b enhances the passivation effect and provides the additional benefit of improving the durability of the passivation in high temperature processes.

In contrast to implanted wafers, wafers 100 passivated with the method 200 contain no implanted species such as argon or implanted silicon self-interstitials. Unlike poly/amorphous silicon deposition, the damaged front surface 122 is still structurally single crystal silicon.

The single-side polished wafer 100 is manufactured by single side one-step or multistep grinding, and single side polishing with a CMP polisher or with a batch type multiwafer polisher to remove grinding damage only partially to retain residual damage.

Indication for the residual damage are lattice defects, which come visible through oxidation induced stacking faults, pits and/or dislocations seen in wafers 100 using wet oxidation test method, or reduced minority carrier lifetime of wafers 100 compared to similar wafers having no residual damage left using minority carrier lifetime or SPV test methods.

Alternatively, the wafers 100 can be made as double side polished by replacing the single-side polishing with a double side polisher. The residual damage can be left in one side or on both sides, when the wafers 100 are grinded on one side or both sides, accordingly.

Figure 3:
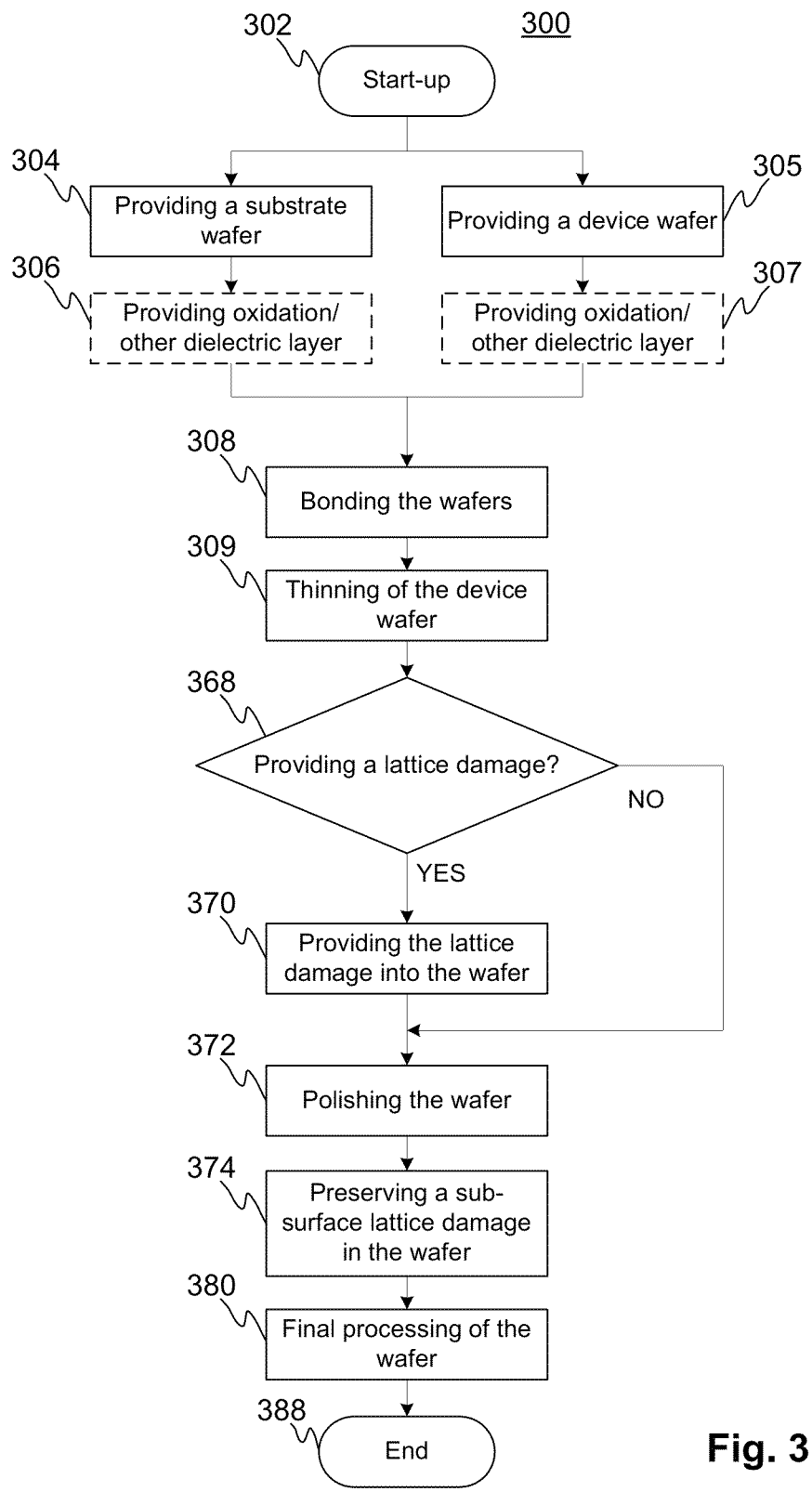
FIG. 3 illustrates an exemplary flowchart of a method for manufacturing a silicon-on-insulator (SOI) wafer.

FIG. 3 illustrates a method 300 for manufacturing a SOI wafer, where the residual damage is made on the SOI wafer, which comprises a silicon substrate wafer and a silicon device layer isolated with a dielectric layer. This dielectric layer can be silicon dioxide, silicon nitride, or other dielectric of combination of different dielectric layers. The residual damage can be left on the device layer.

In step 302, during the start up, necessary operations are performed and in steps 304, 305 the substrate and device wafers are provided.

In steps 306, 307 it is possible to provide on at least one of the wafers oxidation or other dielectric layer.

In step 308 the wafers are bonded to each other and the device wafer, which is on top of the bonded structure, is thinned in step 309.

In step 368, if the thinned structure already comprises a sufficient crystal lattice damage and it is meant to utilize, the damaged structure is polished e.g. by controlled CMP-polishing in step 272.

Alternatively, if there is a need to provide a crystal lattice damage mechanically into the thinned device wafer by means of e.g. grinding, brush damaging, laser manipulation, or wet sand blasting, in step 368, the thinned structure are processed for providing such crystal damage in step 370 and then polished in step 372.

In step 374, the polishing process is controlled so that at least a part of the provided lattice damage is preserved and, then, it is possible to deposit a polysilicon layer on top of the lattice damage zone and to polish the deposited polysilicon layer.

In step 380, the polished structure having the residual lattice damage—and possibly the polysilicon layer—is final processed by sorting, cleaning, inspecting, and packing.

Then, in step 388, the method 300 ends.

Alternatively, the residual damage can be made on the substrate wafer, when the SOI wafer is made with a low temperature bonding process preserving the residual damage. Also, other manufacturing steps of these wafers are low enough to retain the residual damage. Typically maximum temperature to retain this damage is less than 1000° C. or preferably less than 800° C., and optimally below 600° C. For such SOI processes in these temperature, limitations are too restrictive and the inclusion of the polysilicon layer on top of the lattice damaged zone improves the durability of the passivation in high temperature processes.

The residual damage can be made on the SOI wafer similarly as on the polished wafer 100 with damaging the surface 122 with pulsed laser beam scanning across the surface. Laser power is adjusted so that the damage threshold in silicon is exceeded, but there is no excessive ablation of the silicon from the surface 122.

The residual damage can be made on the SOI wafer similarly as on the polished wafer 100 with wet or dry sandblasting the wafer surface 122 with abrasive particles. Particles can be any hard particles from submicrometer size to 30 μm size, beneficially damaging the surface 122 with silicon dioxide (silica) particles of 1-10 μm in size, but also other abrasives like alumina, zirconia, or silicon carbide can be used.

By modifying the final stages of material removal in the silicon wafering process, it is possible to combine sufficient lattice damage for passivation, and surface quality is still compatible with IC processing, at the relatively moderate linewidths needed for manufacturing RF IPDs. The generation of trap sites within the silicon bandgap can be achieved through a number of mechanical processing steps, e.g. a wafer slicing, lapping, grinding, brush damaging, and wet sand blasting.

The principle presented here applies to all these techniques, as the fundamental approach does not differ between these alternatives. The method 200 presented here is based on rotational grinding with grinding parameters selected for sufficiently deep, uniform lattice damage. This step is followed by a highly controlled material removal aiming at preserving sufficient lattice damage level, but including CMP-polishing to ensure that substrate can be patterned in lithography for device processing. As with implantation and polysilicon deposition techniques, this method 200 is not compatible with long thermal oxidation, but as vast, increasing majority of industrial IPD processes are based on low-temperature dielectric deposition techniques, this should not be considered a major drawback.

Wafers 100 manufactured according to the method 200 have been used for processing of RF passive devices. The passive devices tested include transmission lines (co-planar waveguides), planar inductors, and filter structures. The successful results confirm that the final surface is fully compatible with the processes used in manufacturing RF passive devices, and that layers 120b generated in the substrate 100 have dramatically improved the transmission line attenuation and Q-factors in various inductor structures. This proves that the parasitic surface condition has been suppressed as designed.

Process controls are indispensable for ensuring that the readymade wafers 100 incorporating the in-built surface passivation are consistent in their properties. This is affected through surface recombination velocity analysis, which is based on recombination lifetime analysis. As this measurement can be calibrated against RF performance achieved, it is highly repeatable and provides full wafer mapping, it is well suited for the purpose.

Figure 4A:
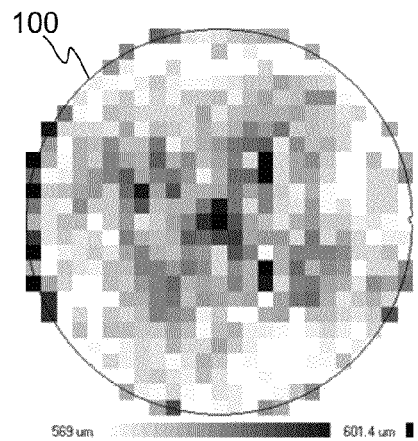
FIGS. 4*a*-4*c* illustrate charge carrier diffusion length mapping images of a front side damaged wafer, a neutral species implanted wafer, and a front side damaged wafer with a polysilicon layer.
Figure 4B:
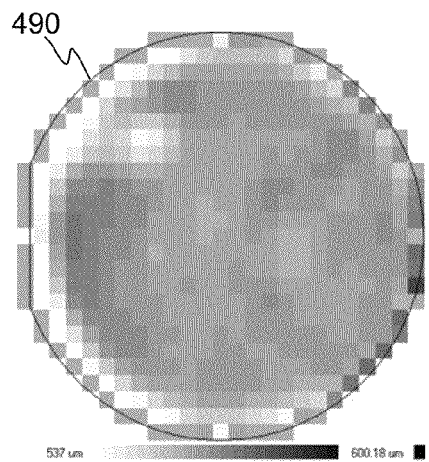
Figure 4C:
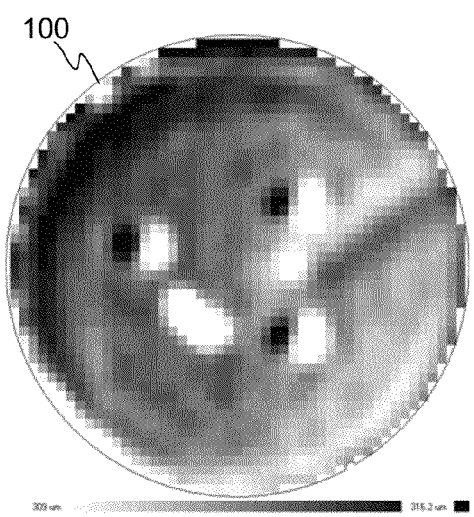

FIG. 4a illustrates a charge carrier diffusion length mapping image of a front side damaged HRS wafer 100 (average diffusion length 576 μm), FIG. 4b a mapping image of a neutral species implanted wafer 490 (average diffusion length 558 μm) having similar trapping efficiencies on a basis of a recombination velocities analysis, and FIG. 4c a mapping image of a front side damaged HRS wafer 100 with a polysilicon layer.

This analysis is used to verify that the trapping efficiency achieved with the manufactured passivation layer 120b is similar to that achieved with the existing methods. This process control can also be extended to verification of the compatibility of the passivation method described with the various device processes used in manufacturing of the RF passives devices.

In RF performance analysis passive devices manufactured such a wafer 100 have shown improved performance from 20 kHz up to 50 or even 80 GHz, depending of passive components tested.

The invention has been now explained above with reference to the aforesaid exemplary embodiments and the several advantages of the invention have been demonstrated. It is clear that the invention is not only restricted to these embodiments, but comprises all possible embodiments within the spirit and scope of the invention thought and the following claims.

The invention claimed is:

1. A high-resistivity silicon substrate (100) with a reduced radio frequency (RF) loss for a radio frequency integrated passive device, the substrate comprising:
    a bulk zone (110) comprising high-resistivity bulk silicon; and
    a preserved sub-surface lattice damage zone (120b), which is processed into a front surface (122) of the substrate, wherein the lattice damage zone forms the front surface, wherein the front surface is a chemical-mechanical planarization-polished front surface,
    wherein the lattice damage zone comprises fractured silicon above the bulk zone, and
    wherein the lattice damage zone suppresses a parasitic surface conduction to achieve the RF loss reduction of the substrate.

2. The substrate of claim 1, wherein the front surface is structurally single crystal silicon.

3. The substrate of claim 1, wherein the preserved lattice damage zone is processed mechanically by slicing (210), lapping (220), grinding (240), brush damaging (250), laser manipulation, or wet blasting (250).

4. The substrate of claim 1, wherein the grinding is a rotational fixed abrasive grinding and/or the grinding is executed by a two-step grinding comprising a coarse grinding and a fine grinding.

5. The substrate of claim 1, which comprises a polysilicon layer (130) on a top of the preserved lattice damage zone.

6. The substrate of claim 5, wherein a thickness of the polysilicon layer is 0.2-8.0 μm.

7. The substrate of claim 5, wherein the thickness of the polysilicon layer is 0.4-6.0 μm.

8. A method (200) for manufacturing the high-resistivity silicon substrate (100) with the reduced radio frequency (RF) loss of claim 1 for a radio frequency integrated passive device, the method comprising:
  growing (204) a high-resistivity silicon;
  processing (210, 220, 240, 270) the grown silicon by slicing (210) a silicon wafer from the grown silicon and by thinning (220, 240) the sliced silicon wafer, the processing achieves a lattice damage zone (120a, 120b) comprising fractured silicon into a processed silicon wafer;
  chemical-mechanical planarization-polishing (250, 272) the processed silicon wafer for obtaining the substrate, which comprises a bulk zone (110) comprising high-resistivity bulk silicon;
  preserving (260, 274), by the chemical-mechanical planarization-polishing, at least a part (120b) of the lattice damage zone above the bulk zone so that the lattice damage zone forms a chemical-mechanical planarization-polished front surface of the substrate and comprises fractured silicon above the bulk zone; and
  the lattice damage zone suppressing a parasitic surface conduction to achieve the RF loss reduction of the substrate.

9. A radio frequency integrated passive device comprising the high-resistivity silicon substrate (100) with a reduced radio frequency loss of claim 1.

10. The substrate of claim 1, wherein the front side is structurally single crystal silicon.

* * * * *